(12) United States Patent
Flores et al.

(10) Patent No.: US 9,786,409 B2
(45) Date of Patent: Oct. 10, 2017

(54) METATHESIS POLYMERS AS DIELECTRICS

(71) Applicant: BASF SE, Ludwigshafen (DE)

(72) Inventors: Jean-Charles Flores, Mulhouse (FR); Emmanuel Martin, Folgensbourg (FR); Patrice Bujard, Courtepin (CH)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 14/392,298

(22) PCT Filed: Jun. 23, 2014

(86) PCT No.: PCT/EP2014/063113
§ 371 (c)(1),
(2) Date: Dec. 23, 2015

(87) PCT Pub. No.: WO2014/206916
PCT Pub. Date: Dec. 31, 2014

(65) Prior Publication Data
US 2016/0276060 A1    Sep. 22, 2016

(30) Foreign Application Priority Data

Jun. 27, 2013   (EP) .................................... 13174013

(51) Int. Cl.
*C09B 57/00*   (2006.01)
*C09B 69/10*   (2006.01)
(Continued)

(52) U.S. Cl.
CPC ........... *H01B 3/448* (2013.01); *C08F 232/00* (2013.01); *C08G 61/08* (2013.01); *C08G 61/12* (2013.01); *C08G 61/125* (2013.01);

*C09B 57/004* (2013.01); *C09B 69/109* (2013.01); *H01L 27/283* (2013.01); *H01L 28/40* (2013.01); *H01L 51/0035* (2013.01); *H01L 51/0096* (2013.01);
(Continued)

(58) Field of Classification Search
None
See application file for complete search history.

(56) References Cited

U.S. PATENT DOCUMENTS 5,849,972  A    12/1998  Vicari et al.
6,407,190  B1    6/2002  Van Der Schaaf et al.
(Continued)

FOREIGN PATENT DOCUMENTS

DE    102004009803 A1    9/2005
EP         2239561 A1   10/2010
(Continued)

OTHER PUBLICATIONS

Zha, Y. et al., "Nanostructured Block-Random Copolymers with Tunable Magnetic Properties" Journal of the American Chemical Society, 2012, vol. 134, pp. 14535-14541.*
(Continued)

*Primary Examiner* — Jay C Chang
(74) *Attorney, Agent, or Firm* — Drinker Biddle & Reath LLP

(57) ABSTRACT

Oxacycloolefinic polymers as typically obtained by metathesis polymerization using Ru-catalysts, show good solubility and are well suitable as dielectric material in electronic devices such as capacitors and organic field effect transistors.

14 Claims, 2 Drawing Sheets

(51) Int. Cl.

| | |
|---|---|
| *C08F 232/00* | (2006.01) |
| *C08G 61/08* | (2006.01) |
| *C08G 61/12* | (2006.01) |
| *H01B 3/44* | (2006.01) |
| *H01L 51/05* | (2006.01) |
| *H01L 51/00* | (2006.01) |
| *H01L 49/02* | (2006.01) |
| *H01L 27/28* | (2006.01) |

(52) U.S. Cl.
CPC ........ *H01L 51/052* (2013.01); *C08G 2261/11* (2013.01); *C08G 2261/312* (2013.01); *C08G 2261/3241* (2013.01); *C08G 2261/3242* (2013.01); *C08G 2261/3324* (2013.01); *C08G 2261/3342* (2013.01); *C08G 2261/418* (2013.01); *C08G 2261/65* (2013.01); *C08G 2261/92* (2013.01); *C08G 2261/94* (2013.01); *H01L 51/0541* (2013.01)

(56) References Cited

U.S. PATENT DOCUMENTS

| | | | |
|---|---|---|---|
| 6,451,459 | B1 | 9/2002 | Tieke et al. |
| 6,465,554 | B1 | 10/2002 | Van Der Schaaf et al. |
| 6,852,898 | B2 | 2/2005 | Schulz et al. |
| 7,037,993 | B2 | 5/2006 | Taguchi et al. |
| 7,259,285 | B1 | 8/2007 | Walter et al. |
| 2008/0045766 | A1 | 2/2008 | Schubert et al. |
| 2008/0194740 | A1 | 8/2008 | Elce et al. |
| 2012/0056183 | A1* | 3/2012 | Mueller ................ C08F 232/00 257/57 |
| 2012/0056249 | A1 | 3/2012 | Mueller et al. |
| 2014/0299871 | A1 | 10/2014 | Bujard et al. |
| 2014/0332730 | A1 | 11/2014 | Hayoz et al. |
| 2015/0029638 | A1 | 1/2015 | Kirner et al. |

FOREIGN PATENT DOCUMENTS

| | | |
|---|---|---|
| WO | WO-03/041185 A2 | 5/2003 |
| WO | WO-2005/049695 A1 | 6/2005 |
| WO | WO-2008/000664 A1 | 1/2008 |
| WO | WO-2010/049321 A1 | 5/2010 |
| WO | WO-2010/049323 A1 | 5/2010 |
| WO | WO-2010/108873 A1 | 9/2010 |
| WO | WO-2010/115767 A1 | 10/2010 |
| WO | WO-2010/136352 A1 | 12/2010 |
| WO | WO-2010/136353 A1 | 12/2010 |
| WO | WO-2012/028278 A1 | 3/2012 |
| WO | WO-2014/180704 A1 | 11/2014 |
| WO | WO-2015/004563 A1 | 1/2015 |

OTHER PUBLICATIONS

U.S. Appl. No. 14/888,574, Kirner et al.
U.S. Appl. No. 14/903,138, Zhou et al.
European Search Report for European Application No. EP13174013 dated Nov. 21, 2013.
Çetinkaya, S., et al., "Synthesis of high-Tg polymers via ROMP of oxanorbornene dicarboximides with halogen groups", Heteroatom Chemistry, vol. 21, No. 1, (2010), pp. 36-43.
International Search Report for PCT/EP2014/063113 mailed Aug. 1, 2014.
Jang, J., et al., "High Tg Cyclic Olefin Copolymer Gate Dielectrics for N,N'-Ditridecyl Perylene Diimide Based Field-Effect Transistors: Improving Performance and Stability with Thermal Treatment", Advanced Functional Materials, vol. 20, No. 16, (2010), pp. 2611-2618.
Klug, A., et al., "Organic field-effect transistor based sensors with sensitive gate dielectrics used for low-concentration ammonia detection", Organic Electronics, vol. 14, No. 2, (2013), pp. 500-504.

* cited by examiner

METATHESIS POLYMERS AS DIELECTRICS

CROSS-REFERENCE TO RELATED APPLICATIONS

This application is a national stage application (under 35 U.S.C. §371) of PCT/EP2014/063113, filed Jun. 23, 2014, which claims benefit of European Application No. 13174013.6, filed Jun. 27, 2013, both of which are incorporated herein by reference in their entirety.

The present invention relates to a process for the preparation of an organic electronic device, such as a capacitor or transistor on a substrate, to the device obtainable by that process, to certain oxacycloolefinic polymers and their use as dielectrics, especially as dielectric layer in printed electronic devices such as capacitors and organic field-effect transistors (OFETs).

Transistors, and in particular OFETs, are used e.g. as components for printed electronic devices such as organic light emitting display, e-paper, liquid crystal display and radiofrequency identification tags.

An organic field effect transistor (OFET) comprises a semiconducting layer comprising an organic semiconducting material, a dielectric layer comprising a dielectric material, a gate electrode and source/drain electrodes.

Especially desirable are OFETs wherein the dielectric material can be applied by solution processing techniques. Solution processing techniques are convenient from the point of processability, and can also be applied to plastic substrates. Thus, organic dielectric materials, which are compatible with solution processing techniques, allow the production of low cost organic field effect transistors on flexible substrates.

Oxanorbornene dicarboximides have been polymerized by ring opening metathesis polymerization (ROMP) to obtain amorphous polymers (Cetinkaya et al., Heteroatom Chemistry (2010), 21, 36-43), or copolymers with tunable magnetic properties (Zha et al., J. Am. Chem. Soc. (2012), 134, 14534).

WO 12/028278 and US 2008/194740 disclose certain layers comprising a cycloolefinic polymer prepared by Ni-catalysis. WO 12/028279 discloses the same type of polymer for use as a gate dielectric layer in contact with a semiconductor layer.

It is the object of the present invention to provide a dielectric material which allows easy solution processing while resulting in good dielectric properties and adherence.

It has now been found that oxacycloolefinic polymers, as typically obtained by Ru-carbene catalyzed ring-opening metathesis polymerization of a bicyclic oxaolefin, show such advantageous properties as a dielectric material.

The present invention thus primarily pertains to an electronic device containing at least one dielectric material which comprises an oxacycloolefinic polymer.

A further advantage of the present dielectric comprising an oxacycloolefinic polymer is its solubility in rather polar solvents, which property allows for solvent processing upon previous layer(s) of material (e.g. organic semiconductors), which show low tendency to dissolve in such media.

Ru-carbenes and their use as catalysts in the metathesis polymerization reaction have been widely described in literature, see e.g. U.S. Pat. Nos. 6,407,190, 6,465,554 and publications cited therein (e.g. column 1, lines 9-37 of U.S. Pat. No. 6,465,554); U.S. Pat. No. 7,037,993 (e.g. column 11, line 34, to col. 13 line 10); and references cited further above; examples are bis(tricyclohexylphosphine)benzylidine ruthenium(IV) dichloride,

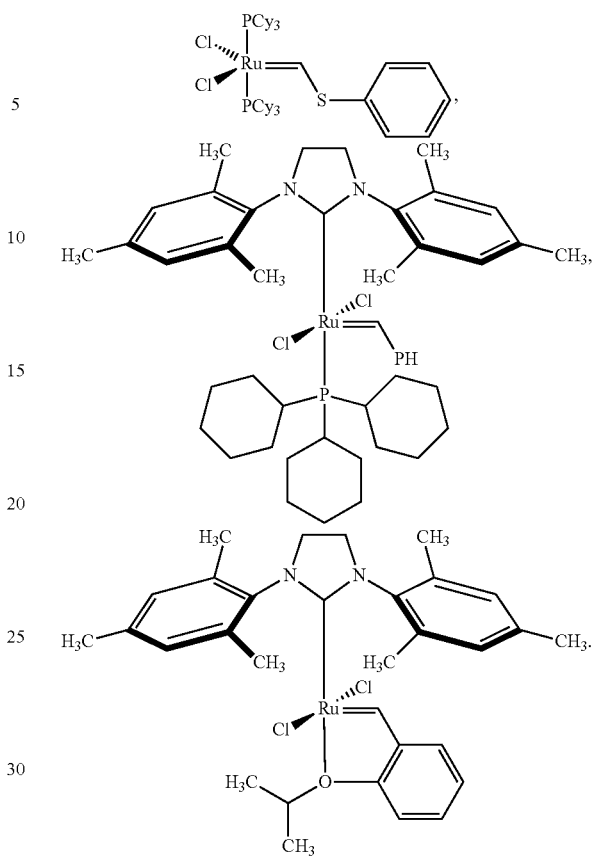

The educt for metathesis polymerization is generally described as a strained cycloolefin, typically a bicyclic olefin such as norbornene (bicyclo[2.2.1]hept-2-ene), which may be unsubstituted or substituted. The type of catalyst thereby determines the type of polymer chain obtained; Ni-catalysts generally lead to polymer chains wherein the original bicyclic structure of the monomer is maintained and the polymer bonds are formed by the former olefinic double bonds. The present Ruthenium carbene catalysts lead to the opening of one ring with formation of a polymer chain containing olefinic double bonds in their non-cyclic parts, as apparent from the below scheme:

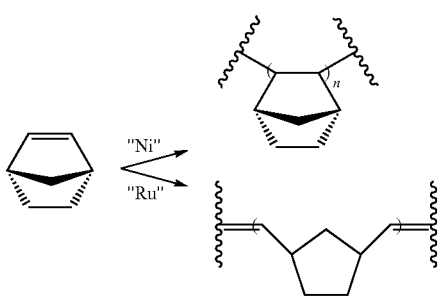

wherein n denotes the number of repeating units within the polymer chain and "Ru" stands for the Ru-carbene catalyst to be used in accordance with the present invention.

The oxacycloolefinic polymer is, consequently, obtained by Ru-carbene catalyzed polymerization of a bicyclic oxaolefin. "Oxa" therein denotes an oxygen atom replacing a CH2-moiety within the bicyclic ring system of a bicycloolefin. Typical example is a norbornene, wherein one CH2 has been replaced by oxygen, thus conforming to the structure bicyclo[2.2.1]-5-oxa-hept-2-ene, bicyclo[2.2.1]-6-oxa-hept-2-ene or bicyclo[2.2.1]-7-oxa-hept-2-ene, each of which may be unsubstituted or substituted. A preferred example for such an educt is an oxanorbornene of the formula I

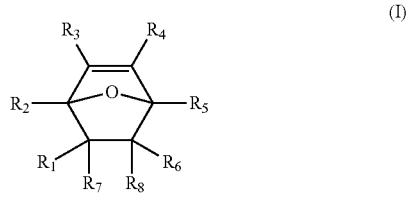

(I)

wherein
each of $R_1$ to $R_6$ are selected from hydrogen and $C_1$-$C_4$alkyl; and $R_7$ and $R_8$ are hydrogen or a substituent; or $R_7$ and $R_8$ form, together with the carbon atoms they are attached to, a saturated or unsaturated carbocyclic ring of 5 to 12 carbon atoms, which is unsubstituted or substituted, or a saturated or unsaturated ring comprising 4 to 11 carbon atoms and 1 or 2 oxygen atoms or groups $NR_9$, with $R_9$ being hydrogen or a substituent, as ring members, which ring is unsubstituted or substituted.

The electronic device according to the present invention thus typically comprises an oxacycloolefinic polymer of the formula II

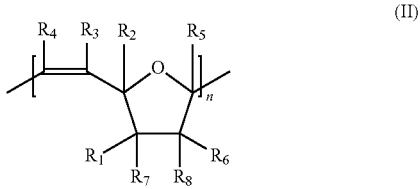

(II)

wherein n ranges from 3 to 100 000, and each of $R_1$ to $R_8$ are as defined for formula I above. More preferably, the oxacycloolefinic polymer comprises a polymer chain of the formula III

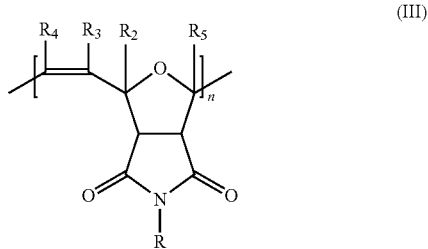

(III)

wherein each of n and R2 to R5 are as defined above, and
R is hydrogen, C1-C25alkyl, C1-C25haloalkyl, phenyl, phenyl-C1-C4alkyl, cyclopentyl, cyclohexyl, wherein phenyl moiety or cyclopentyl or cyclohexyl moiety itself is unsubstituted or substituted by C1-C4alkyl, C1-C4alkoxy, OH, halogen.

The electronic device according to the present invention usually is selected from capacitors, transistors such as organic field effect transistors, and devices comprising said capacitor and/or transistor; it contains the oxacycloolefinic polymer preferably as a capacitor layer or gate insulating layer, typically as part of an organic thin film transistor such as an OFET, thus making use of its superior dielectric properties.

Any substituent, whenever mentioned, is typically selected from halogen, C1-C25alkyl, C2-C25alkenyl, C1-C25alkylthio, C1-C25alkoxy, C2-C25alkenyloxy, C4-C10aryl, C1-C9heteroaryl, C3-C12cycloalkyl, C2-C11heterocycloalkyl, each of which is unsubstituted or substituted by R'; or is C2-C25alkyl, C3-C25alkenyl, C2-C25alkylthio, C2-C25alkoxy, C3-C25alkenyloxy, which is interrupted in its alkyl part by O, CO, COO, CONR, CONRCO, S, SO, SO2, NR, and is unsubstituted or substituted by R'; or is selected from the residues OR, COR, CH=NR, CH=N—OH, CH=N—OR, COOR, CONHR, CONRR', CONH—NHR, CONH—NRR', SO2R, SO3R, SO2NHR, SO2NRR', SO2NH—NHR, SO2NH—NRR', S(O)R, S(O)OR, S(O)NHR, S(O)NRR', S(O)NH—NHR, S(O)NH—NRR', SiRR'R", PORR', PO(OR)R', PO(OR)2, PO(NHR)2, PO(NRR')2, CN, NO2, NHR, NRR', NH—NHR, NH—NRR', CONROH; and if bonding to saturated carbon may also be oxo;
and wherein R, R' and R" independently are selected from C1-C25alkyl, C1-C25haloalkyl, C5-C10aryl, C6-C12arylalkyl, C3-C12cycloalkyl, preferably from C1-C6alkyl, phenyl, benzyl, cyclopentyl, cyclohexyl; and R may also be hydrogen;
where each aryl or heteroaryl or cycloalkyl itself is unsubstituted or substituted by C1-C4alkyl, C2-C4alkenyl, C1-C4alkoxy, OH, CHO, C1-C4alkyl-carbonyl, C1-C4alkyl-carbonyloxy, C1-C4alkoxy-carbonyl, allyloxy, halogen.

The invention thus pertains to an electronic device, generally an organic electronic device, as it may be prepared in a printing process on a substrate. The substrate may be glass, but is typically a plastic film or sheet. Typical devices are capacitors, transistors such as an electronic field effect transistor (OFET), or devices comprising said capacitor and/or transistor. The device of the invention contains at least one dielectric material, usually in the form of a dielectric layer, which comprises the present oxacycloolefinic polymer. The device of the invention generally contains at least one further layer of a functional material, mainly selected from conductors and semiconductors, which usually stands in direct contact with the present oxacycloolefinic polymer dielectric material or layer; examples are OFETs containing the layer of dielectric material according to the invention in direct contact with the electrode and/or the semiconductor.

Present invention further provides a process for the preparation of an electronic device, such as a capacitor or transistor on a substrate, which process comprises the steps of
i) providing a solution or dispersion of an oxacycloolefinic polymer, as described above, in a suitable solvent, and
ii) forming a layer on a substrate, an electrode material and/or a semiconductor, and drying said layer.

Preferably, the process does not comprise a step of heat treatment at a temperature of >=150° C., More preferably, the process does not comprise a step of heat treatment at a temperature of >=140° C. Most preferably, the process does not comprise a step of heat treatment at a temperature of >=120° C. Accordingly, the heat treatment in step (ii), if present, usually requires heating the layer to a temperature from the range 30 to 150° C., preferably 40 to 140° C., especially 50 to 120° C.

Suitable as the solvent (hereinbelow also recalled as organic solvent A) is any solvent (or solvent mixture), which is able to dissolve at least 2% by weight, preferably at least 5% by weight, more preferably, at least 8% by weight of the oxacycloolefinic polymer.

As the organic solvent A, generally any solvent may be chosen which has a boiling point (at ambient pressure) from the range of about 80 to 250° C. Solvent A may be a mixture of such solvents. In a preferred process, any component of solvent A has a boiling point from the range 100-220° C., especially 100-200° C. Also of importance are blends using a main solvent (e.g. 70% b.w. or more, such as 95%) having a boiling point around 150° C. (e.g. 120 to 180° C.) and a minor component (30% b.w. or less, such as 5%) having a high boiling point of more than 200° C., e.g. from the range 200-250° C.

Preferably, the organic solvent A is selected from the group consisting of N-methylpyrrolidone, $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof.

Examples of $C_{1-4}$-alkyl-C(O)—$C_{1-4}$-alkyl are ethyl isopropyl ketone, methyl ethyl ketone and methyl isobutyl ketone.

Examples of $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, are ethyl acetate, butyl acetate, isobutyl acetate, (2-methoxy)ethyl acetate, (2-methoxy)propyl acetate and ethyl lactate.

An example of $C_{1-4}$-alkyl-O—$C_{1-4}$-alkylene-O—$C_{1-4}$-alkylene-O—$C_{1-4}$-alkyl is diethyleneglycoldimethylether.

More preferably, the organic solvent A is selected from the group consisting of $C_{4-8}$-cycloalkanone, $C_{1-4}$-alkyl-C(O)—$C_{1-4}$-alkyl, $C_{1-4}$-alkanoic acid $C_{1-4}$-alkyl ester, wherein the $C_{1-4}$-alkyl or the $C_{1-4}$-alkanoic acid can be substituted by hydroxyl or O—$C_{1-4}$-alkyl, and $C_{1-4}$-alkyl-O—$C_{1-4}$-alkylene-O—$C_{1-4}$-alkylene-O—$C_{1-4}$-alkyl, and mixtures thereof. Examples are methyl ethyl ketone (b.p. 80° C.), 1,4-dioxane, methyl-isobutyl ketone, butylacetate, 2-hexanone, 3-hexanone, 2-methoxy-1,3-dioxolane, Propylene glycol methyl ether acetate (PGMEA), ethyl lactate, DiGlyme, 5-methyl-3H-furan-2-one (b.p. 169° C. ["alpha-angelica lactone"]), dipropylene glycol dimethyl ether (b.p. 175° C. [ProGlyde DMM]), N-methylpyrrolidone (NMP), gamma-butyrolactone, acetophenone, isophorone, gamma-aprolactone, 1,2-propylene carbonate (b.p. 241° C.); blends of Propylene glycol methyl ether acetate (PGMEA, b.p. 145° C., e.g. 95%) and proyplene carbonate (e.g. 5%).

Most preferably, the organic solvent A is selected from the group consisting of $C_{5-6}$-cycloalkanone, $C_{1-4}$-alkanoic acid $C_{1-4}$-alkyl ester, and mixtures thereof. Even most preferably the organic solvent A is cyclopentanone or PGMEA or mixtures thereof. In particular preferred organic solvents A are PGMEA or mixtures of PGMEA and pentanone, wherein the weight ratio of PGMEA/cyclopentanone is at least from 99/1 to 20/80, more preferably from 99/1 to 30/70.

If the oxacycloolefinic polymer is applied as a solution in an organic solvent A on the layer of the transistor or on the substrate, the oxacycloolefinic polymer can be applied by any possible solution process, such as spin-coating, drop-casting or printing.

After applying oxacycloolefinic polymer as a solution in an organic solvent A on the layer of the transistor or on the substrate, a heat treatment at a temperature of below 140° C., for example at a temperature in the range of 60 to 120° C., preferably at a temperature of below 120° C., for example in the range of 60 to 110° C. can be performed.

The layer comprising oxacycloolefinic polymer can have a thickness in the range of 100 to 1000 nm, preferably, in the range of 300 to 1000 nm, more preferably 300 to 700 nm.

The layer comprising oxacycloolefinic polymer can comprise from 50 to 100% by weight, preferably from 80 to 100%, preferably 90 to 100% by weight of oxacycloolefinic polymer based on the weight of the layer comprising oxacycloolefinic polymer. Preferably, the layer comprising oxacycloolefinic polymer essentially consists of oxacycloolefinic polymer.

Examples of aromatic rings are phenyl and naphthyl. Phenyl is preferred.

Examples of halogen are fluoro, chloro and bromo.

Examples of $C_{1-10}$-alkyl are methyl, ethyl, propyl, isopropyl, butyl, sec-butyl, isobutyl, tert-butyl, pentyl, 2-ethylbutyl, hexyl, heptyl, octyl, nonyl and decyl. Examples of propyl and butyl are n-propyl, isopropyl, n-butyl, sec-butyl, isobutyl and tert-butyl.

Examples of $C_{4-8}$-cycloalkyl are cyclobutyl, cyclopentyl, cyclohexyl, cycloheptyl and cyclooctyl.

Examples of $C_{1-10}$-haloalkyl are trifluoromethyl and pentafluoroethyl.

Examples of $C_{2-10}$-alkenyl are vinyl, $CH_2$—CH=$CH_2$, $CH_2$—$CH_2$—CH=$CH_2$.

Examples of $C_{4-10}$-cycloalkenyl are cyclopentyl, cyclohexyl and norbornenyl.

Examples of $C_{1-10}$-alkylene are methylene, ethylene, propylene, butylene, pentylene, hexylene and heptylene. Examples of $C_{1-4}$-alkylene are methylene, ethylene, propylene and butylene Examples of $C_{4-8}$-cycloalkylene are cyclobutylene, cyclopentylene, cyclohexylene and cycloheptylene.

Examples of $C_{1-4}$-alkanoic acid are acetic acid, propionic acid and butyric acid.

The glass transition temperature of the present oxacycloolefinic polymer, as determined by differential scanning calorimetry, is preferably above 90° C., more preferably above 130° C., and more preferably between 150° C. and 300° C.

The molecular weight of the oxacycloolefinic polymer can be in the range of 5000 to 2000000 g/mol, preferably 10000 to 1000000 g/mol (as determined by gel permeation chromatography).

The transistor on a substrate is preferably a field-effect transistor (FET) on a substrate and more preferably an organic field-effect transistor (OFET) on a substrate.

Usually, an organic field effect transistor comprises a dielectric layer and a semiconducting layer. In addition, on organic field effect transistor usually comprises a gate electrode and source/drain electrodes.

Typical designs of organic field effect transistors are the Bottom-Gate design and the Top-Gate design:

In case of the Bottom-Gate Bottom-Contact (BGBC) design, the gate is on top of the substrate and at the bottom of the dielectric layer, the semiconducting layer is at the top of the dielectric layer and the source/drain electrodes are on top of the semiconducting layer.

Another design of a field-effect transistor on a substrate is the Top-Gate Bottom-Contact (TGBC) design: The source/drain electrodes are on top of the substrate and at the bottom of the semiconducting layer, the dielectric layer is on top of the disemiconducting layer and the gate electrode is on top of the dielectric layer. When prepared by solution processing, here the solvents used for dielectrics must be fully orthogonal with respect to the semiconductor (i.e. show good solubility of the dielectric and absolute insolubility of the semiconductor), and additionally compatible with photoresist processing.

The semiconducting layer comprises a semiconducting material. Examples of semiconducting materials are semiconducting materials having p-type conductivity (carrier: holes) and semiconducting materials having n-type conductivity (carrier: electrons).

Examples of semiconductors having n-type conductivity are perylenediimides, naphtalenediimides and fullerenes.

Semiconducting materials having p-type conductivity are preferred. Examples of semiconducting materials having p-type conductivity are molecules such as as rubrene, tetracene, pentacene, 6,13-bis(triisopropylethynyl) pentacene, diindenoperylene, perylenediimide and tetracyanoquinodimethane, and polymers such as polythiophenes, in particular poly 3-hexylthiophene (P3HT), polyfluorene, polydiacetylene, poly 2,5-thienylene vinylene, poly p-phenylene vinylene (PPV) and polymers comprising repeating units having a diketopyrrolopyrrole group (DPP polymers).

Preferably the semiconducting material is a polymer comprising units having a diketopyrrolopyrrole group (DPP polymer).

Examples of DPP polymers and their synthesis are, for example, described in U.S. Pat. No. 6,451,459 B1, WO 2005/049695, WO 2008/000664, WO 2010/049321, WO 2010/049323, WO 2010/108873, WO 2010/115767, WO 2010/136353 and WO 2010/136352.

Preferably, the DPP polymer comprises, preferably essentially consists, of a unit selected from the group consisting of
a polymer unit of formula

 (20)

a copolymer unit of formula

 (21)

a copolymer unit of formula

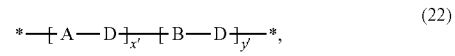 (22)

and
a copolymer unit of formula

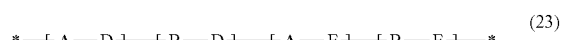 (23)

wherein
n' is 4 to 1000, preferably 4 to 200, more preferably 5 to 100,
x' is 0.995 to 0.005, preferably x' is 0.2 to 0.8,
y' is 0.005 to 0.995, preferably y' is 0.8 to 0.2, and
x'+y'=1;
r' is 0.985 to 0.005,
s' is 0.005 to 0.985,
t' is 0.005 to 0.985,
u' is 0.005 to 0.985, and
r'+s'+t'+u'=1;
A is a group of formula

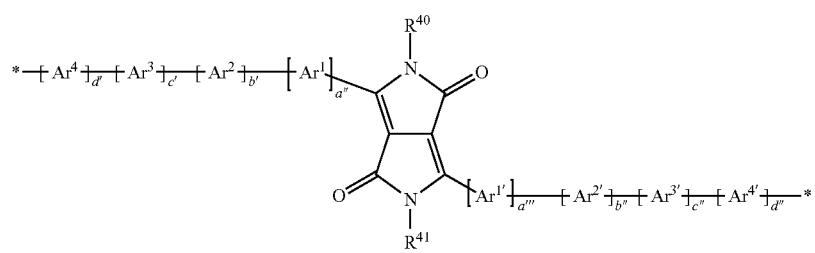 (24)

wherein
a" is 1, 2, or 3,
a'" is 0, 1, 2, or 3,
b' is 0, 1, 2, or 3,
b" is 0, 1, 2, or 3,
c' is 0, 1, 2, or 3,
c" is 0, 1, 2, or 3,
d' is 0, 1, 2, or 3,
d" is 0, 1, 2, or 3,
with the proviso that b" is not 0, if a'" is 0;
$R^{40}$ and $R^{41}$ are the same or different and are selected from the group consisting of hydrogen, $C_1$-$C_{100}$alkyl, —COOR$^{106"}$, $C_1$-$C_{100}$alkyl which is substituted with one or more halogen, hydroxyl, nitro, —CN, or $C_6$-$C_{18}$aryl and/or interrupted by —O—, —COO—, —OCO—, or —S—; $C_7$-$C_{100}$arylalkyl, carbamoyl, $C_5$-$C_{12}$cycloalkyl, which can be substituted one to three times with $C_1$-$C_8$alkyl and/or $C_1$-$C_8$alkoxy, $C_6$-$C_{24}$aryl, in particular phenyl or 1- or 2-naphthyl which can be substituted one to three times with $C_1$-$C_8$alkyl, $C_1$-$C_{25}$thioalkoxy, and/or $C_1$-$C_{25}$alkoxy, or pentafluorophenyl, wherein $R^{106''}$ is $C_1$-$C_{50}$alkyl, preferably $C_4$-$C_{25}$alkyl, $Ar^1$, $Ar^{1'}$, $Ar^2$, $Ar^{2'}$, $Ar^3$, $Ar^{3'}$, $Ar^4$ and $Ar^{4'}$ are independently of each other heteroaromatic, or aromatic rings, which optionally can be condensed and/or substituted, preferably

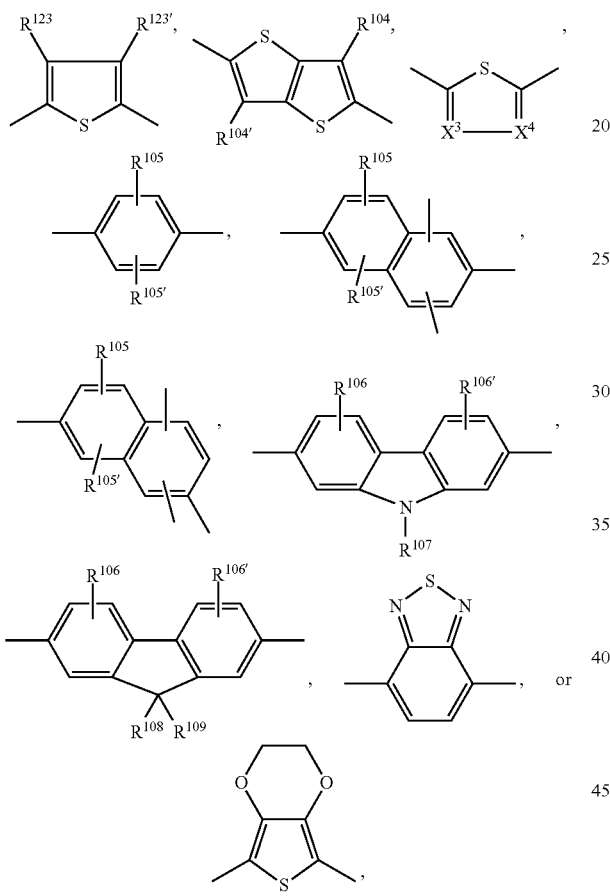

wherein
one of $X^3$ and $X^4$ is N and the other is $CR^{99}$,
wherein $R^{99}$ is hydrogen, halogen, preferably F, or $C_1$-$C_{25}$alkyl, preferably a $C_4$-$C_{25}$alkyl, which may optionally be interrupted by one or more oxygen or sulphur atoms, $C_7$-$C_{25}$arylalkyl, or $C_1$-$C_{25}$alkoxy, $R^{104}$, $R^{104'}$, $R^{123}$ and $R^{123'}$ are independently of each other hydrogen, halogen, preferably F, or $C_1$-$C_{25}$alkyl, preferably a $C_4$-$C_{25}$alkyl, which may optionally be interrupted by one or more oxygen or sulphur atoms, $C_7$-$C_{25}$arylalkyl, or $C_1$-$C_{25}$alkoxy, $R^{105}$, $R^{105'}$, $R^{106}$ and $R^{106'}$ are independently of each other hydrogen, halogen, $C_1$-$C_{25}$alkyl, which may optionally be interrupted by one or more oxygen or sulphur atoms; $C_7$-$C_{25}$arylalkyl, or $C_1$-$C_{18}$alkoxy, $R^{107}$ is $C_7$-$C_{25}$arylalkyl, $C_6$-$C_{18}$aryl; $C_6$-$C_{18}$aryl which is substituted by $C_1$-$C_{18}$alkyl, $C_1$-$C_{18}$perfluoroalkyl, or $C_1$-$C_{18}$alkoxy; $C_1$-$C_{18}$alkyl; $C_1$-$C_{18}$alkyl which is interrupted by —O—, or —S—; or —COOR$^{124}$;

$R^{124}$ is $C_1$-$C_{25}$alkyl, preferably $C_4$-$C_{25}$alkyl, which may optionally be interrupted by one or more oxygen or sulphur atoms, $C_7$-$C_{25}$arylalkyl, $R^{108}$ and $R^{109}$ are independently of each other H, $C_1$-$C_{25}$alkyl, $C_1$-$C_{25}$alkyl which is substituted by E' and/or interrupted by D', $C_7$-$C_{25}$arylalkyl, $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, or $R^{108}$ and $R^{109}$ together form a group of formula =CR$^{110}$R$^{111}$, wherein
$R^{110}$ and $R^{111}$ are independently of each other H, $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, or $C_2$-$C_{20}$heteroaryl, or $C_2$-$C_{20}$heteroaryl which is substituted by G,
or $R^{108}$ and $R^{109}$ together form a five or six membered ring, which optionally can be substituted by $C_1$-$C_{18}$alkyl, $C_1$-$C_{18}$alkyl which is substituted by E' and/or interrupted by D', $C_6$-$C_{24}$aryl, $C_6$-$C_{24}$aryl which is substituted by G, $C_2$-$C_{20}$heteroaryl, $C_2$-$C_{20}$heteroaryl which is substituted by G, $C_2$-$C_{18}$alkenyl, $C_2$-$C_{18}$alkynyl, $C_1$-$C_{18}$alkoxy, $C_1$-$C_{18}$alkoxy which is substituted by E' and/or interrupted by D', or $C_7$-$C_{25}$aralkyl, wherein D' is —CO—, —COO—, —S—, —O—, or —NR$^{112}$—, E' is $C_1$-$C_8$thioalkoxy, $C_1$-$C_8$alkoxy, CN, —NR$^{112}$R$^{113}$, —CONR$^{112}$R$^{113}$, or halogen, G is E', or $C_1$-$C_{18}$alkyl, and $R^{112}$ and $R^{113}$ are independently of each other H; $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl; or $C_1$-$C_{18}$alkyl which is interrupted by —O— and B, D and E are independently of each other a group of formula

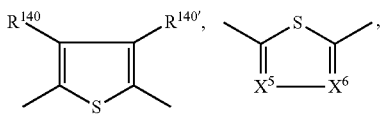

or a group of formula (24),
with the proviso that in case B, D and E are a group of formula (24), they are different from A, wherein
k' is 1,
l' is 0, or 1,
r' is 0, or 1,
z' is 0, or 1, and
$Ar^5$, $Ar^6$, $Ar^7$ and $Ar^8$ are independently of each other a group of formula -continued

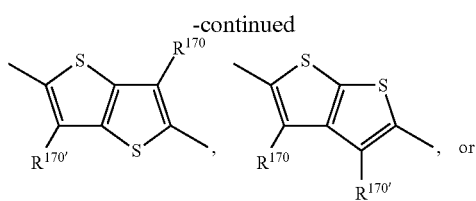, or 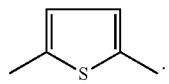

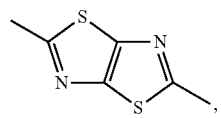, wherein one of $X^5$ and $X^6$ is N and the other is $CR^{140}$, $R^{140}$, $R^{140'}$, $R^{170}$ and $R^{170'}$ are independently of each other H, or a $C_1$-$C_{25}$alkyl, preferably $C_6$-$C_{25}$alkyl, which may optionally be interrupted by one or more oxygen atoms.

Preferred polymers are described in WO2010/049321.

$Ar^1$ and $Ar^{1'}$ are preferably

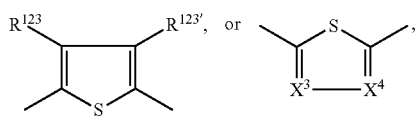

very preferably

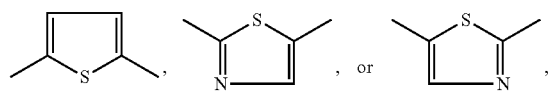

and most preferably

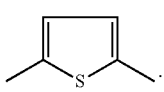

$Ar^2$, $Ar^{2'}$, $Ar^3$, $Ar^{3'}$, $Ar^4$ and $Ar^{4'}$ are preferably

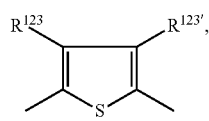

more preferably

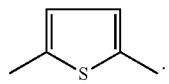

The group of formula

*—[Ar$^5$]$_{k'}$—[Ar$^6$]$_{l'}$—[Ar$^7$]$_{r'}$—[Ar$^8$]$_{z'}$—* is preferably

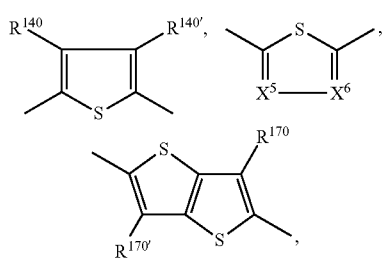

more preferably

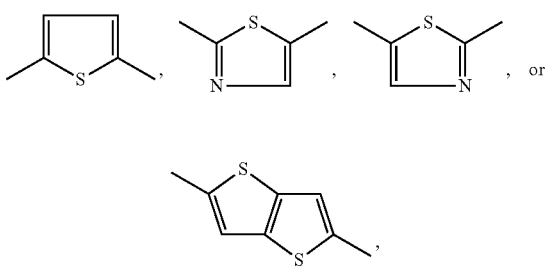

most preferred

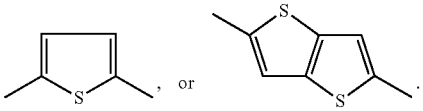

$R^{40}$ and $R^{41}$ are the same or different and are preferably selected from hydrogen, $C_1$-$C_{100}$alkyl, more preferably a $C_8$-$C_{36}$alkyl.

A is preferably selected from the group consisting of

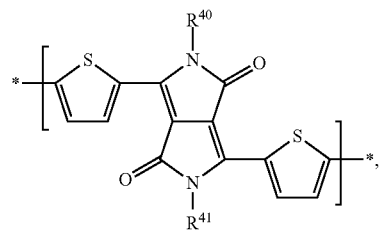

(24a)

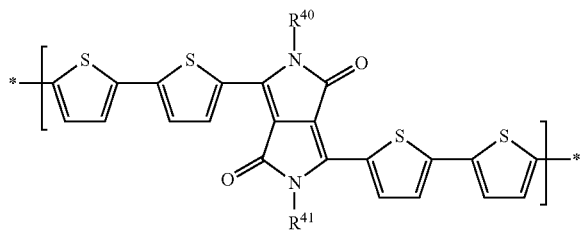

(24b)

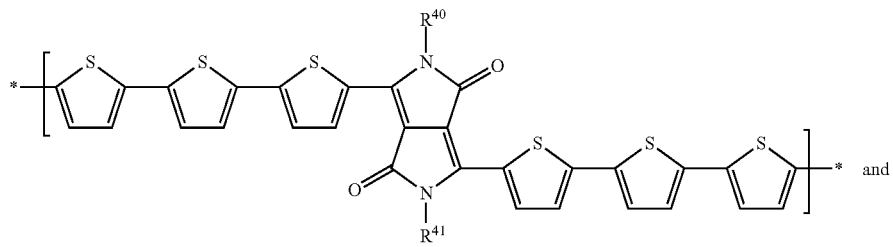
(24c)

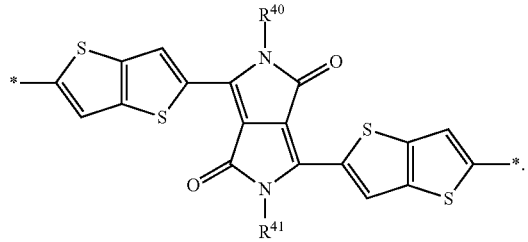
(24d)

Examples of preferred DPP polymers comprising, preferably consisting essentially of, a polymer unit of formula (20) are shown below:

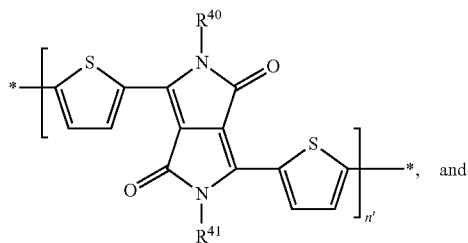
(20-1)

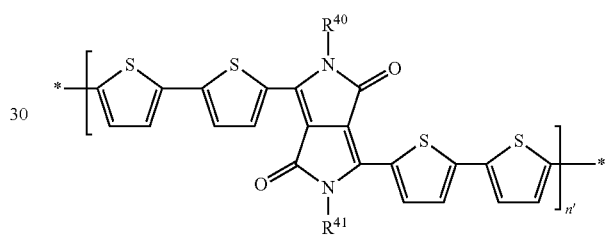
(20-2)

wherein
$R^{40}$ and $R^{41}$ are $C_1$-$C_{36}$alkyl, preferably $C_8$-$C_{36}$alkyl, and n' is 4 to 1000, preferably 4 to 200, more preferably 5 to 100.

Examples of preferred DPP polymers comprising, preferably consisting essentially of, a copolymer unit of formula (21) are shown below:

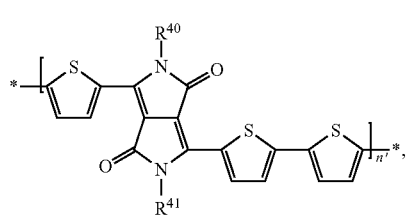
(21-1)

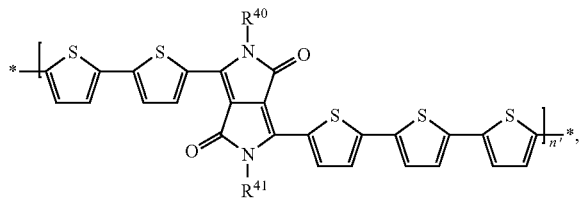
(21-2)

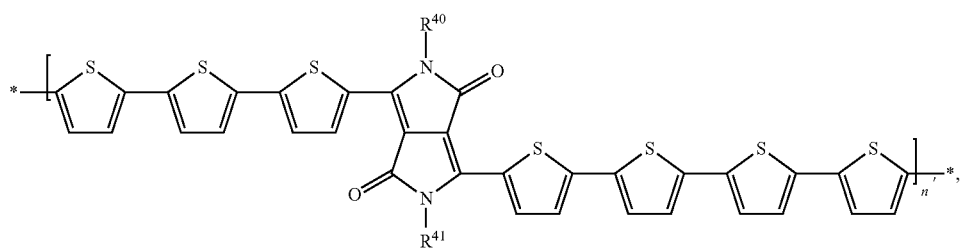
(21-3)

-continued
(21-4)
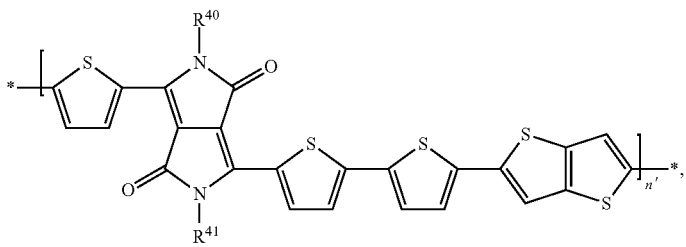
(21-5)
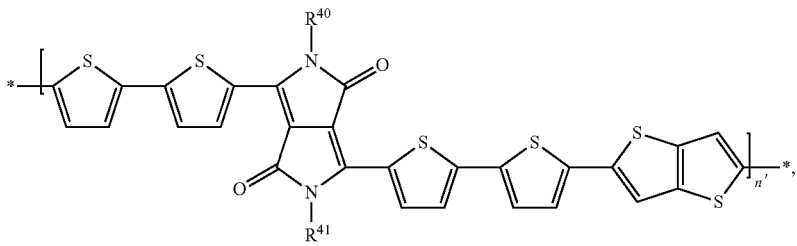
(21-6)
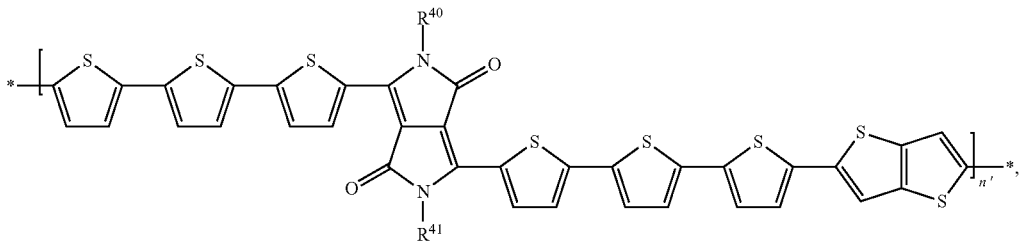
(21-7)
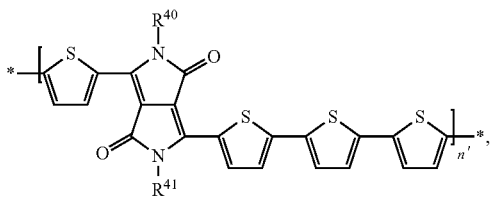
(21-8)
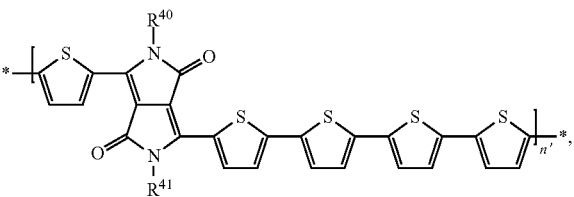
(21-9)
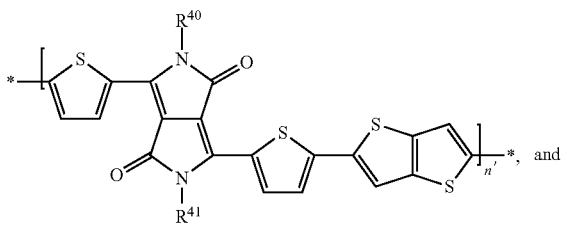
, and
(21-10)
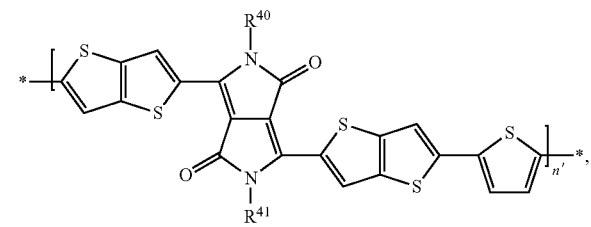
wherein
$R^{40}$ and $R^{41}$ are $C_1$-$C_{36}$alkyl, preferably $C_8$-$C_{36}$alkyl, and n' is 4 to 1000, preferably 4 to 200, more preferably 5 to 100.
Examples of preferred DPP polymers comprising, preferably essentially consisting of, a copolymer unit of formula (22) are shown below:
(22-1)
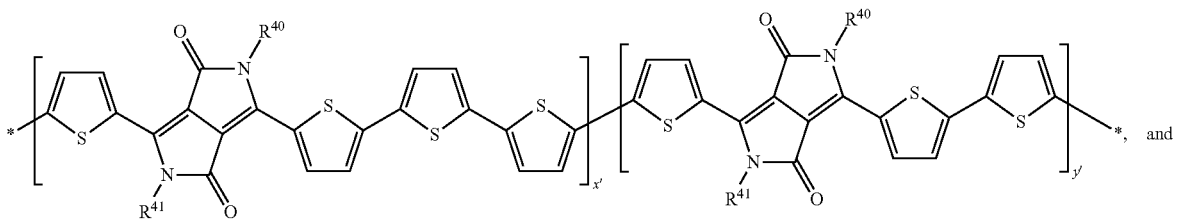
, and

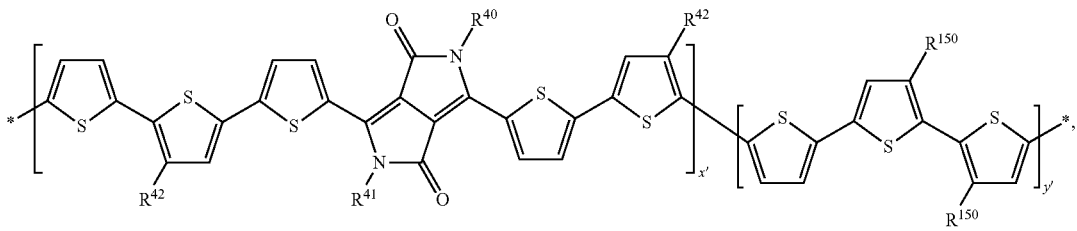

(22-2)

wherein
$R^{40}$ and $R^{41}$ are $C_1$-$C_{36}$alkyl, preferably $C_8$-$C_{36}$alkyl,
$R^{42}$ is $C_1$-$C_{18}$alkyl,
$R^{150}$ is a $C_4$-$C_{18}$alkyl group,
X'=0.995 to 0.005, preferably x'=0.4 to 0.9,
y'=0.005 to 0.995, preferably y'=0.6 to 0.1, and
x+y=1.

DPP Polymers comprising, preferably consisting essentially of, a copolymer unit of formula (22-1) are more preferred than DPP polymers comprising, preferably consisting essentially of, a copolymer unit of formula (22-2).

The DPP polymers preferably have a weight average molecular weight of 4,000 Daltons or greater, especially 4,000 to 2,000,000 Daltons, more preferably 10,000 to 1,000,000 and most preferably 10,000 to 100,000 Daltons.

DPP Polymers comprising, preferably consisting essentially of, a copolymer unit of formula (21-9)

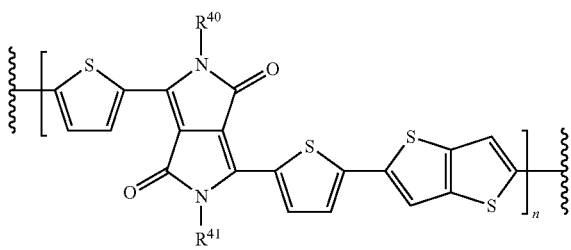

(with R40, R41 being alkyl, such as 2-hexyldecyl)
or a copolymer unit of formula (21-1) are particularly preferred. Reference is, for example made to example 1 of WO2010/049321:

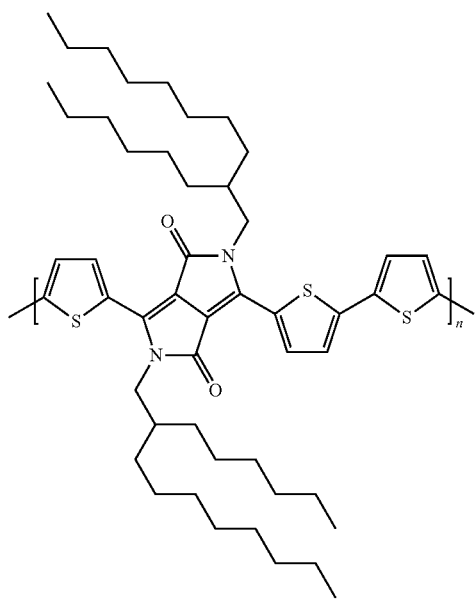

(Mw = 39'500)

The dielectric layer comprises a dielectric material. The dielectric material can be silicium/silicium dioxide, or, preferably, an organic polymer such as poly(methylmethacrylate) (PMMA), poly(4-vinylphenol) (PVP), poly(vinyl alcohol) (PVA), anzocyclobutene (BCB), polyimide (PI).

Preferably, the dielectric layer comprises the present oxacycloolefinic polymer.

The substrate can be any suitable substrate such as glass, or a plastic substrate. Preferably the substrate is a plastic substrate such as polyethersulfone, polycarbonate, polysulfone, polyethylene terephthalate (PET) and polyethylene naphthalate (PEN). More preferably, the plastic substrate is a plastic foil.

Also part of the invention is a transistor obtainable by above process.

An advantage of the process of the present invention is that the present oxacycloolefinic polymer is resistant to shrinkage.

Another advantage of the process of the present invention is that the present oxacycloolefinic polymer shows a high chemical and thermal stability. As a consequence, the process of the present invention can be used to prepare, for example, an organic field effect transistor, wherein the layer comprising present oxacycloolefinic polymer is the dielectric layer, wherein the electrodes on top of the dielectric layer can be applied by evaporation through a shadow mask.

Another advantage of the process of the present invention is that present oxacycloolefinic polymer is soluble in an organic solvent (solvent A). Preferably, it is possible to prepare a 2% by weight, more preferably a 5% by weight and most preferably a 8% by weight solution of present oxacycloolefinic polymer in the organic solvent. Thus, it is possible to apply present oxacycloolefinic polymer by solution processing techniques.

Another advantage of the process of the present invention is that the organic solvent used to dissolve present oxacycloolefinic polymer
(i) preferably has a boiling point (at ambient pressure) of below 160° C., preferably below 150° C., more preferably below 120° C., and thus can be can be removed by heat treatment at a temperature of below 120° C., preferably at a temperature in the range of 60 to 110° C., and
(ii) preferably does not dissolve suitable semiconducting materials such as diketopyrrolopyrol (DPP) thiophenes, and thus allows the formation of a smooth border when applying the present oxacycloolefinic polymer on a semiconducting layer comprising diketopyrrolopyrol (DPP) thiophenes.

Another advantage of the process of the present invention is that all steps of the process can be performed at ambient atmosphere, which means that no special precautions such as nitrogen atmosphere are necessary.

The advantage of the transistor of the present invention, preferably, wherein the transistor is an organic field effect transistor and wherein the layer comprising present oxacyclooleifinic polymer is the dielectric layer and the semiconducting layer comprises a semiconducting material, for example a diketopyrrolopyrrole (DPP) thiophene polymer, is that the transistor shows a high mobility, a high Ion/Ioff ratio and a low gate leakage.

The following examples illustrate the invention. Wherever noted, room temperature (r.t.) depicts a temperature from the range 22-25° C.; over night means a period of 12 to 15 hours; percentages are given by weight, if not indicated otherwise. Molecular weight is as determined by gel permeation chromatography, if not indicated otherwise. The glass transition temperature is determined by differential scanning calorimetry (DSC), using a Mettler-Toledo DSC 822E® with Mettler-Toledo Stare® Software 9.10, closed standard aluminium crucible (40 microliter), sample weighing range 4000-10000 mg, nitrogen 50 ml/min, temperature gradient:

first heating 20-300° C. with 20° C./min, followed by cooling from 300-20° C. with 20° C./min, and
second heating from 20-300° C. with 20° C./min.

Further abbreviations:

Mw molecular weight as obtained by high temperature gel permeation chromatography
NMP N-Methylpyrrolidone
PDI polydispersity (by high temperature gel permeation chromatography)
Tg glass transition temperature
b.p. boiling point (at 1 atmosphere pressure)

EXAMPLE 1 a) Preparation of Monomer 1

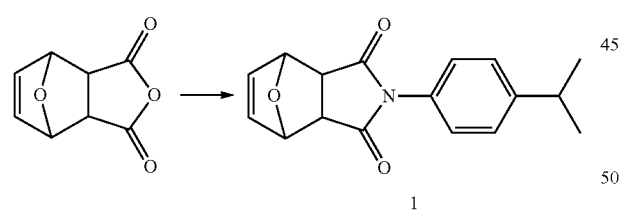

100 g of p-isopropylaniline (1 eq, 0.74 mol) is added to a solution of 122.9 g of exo-3,6-Epoxy-1,2,3,6-tetrahydrophthalic anhydride (1 eq, 0.74 mol) in acetone and stirred for 2 h. The resulting precipitate is filtrated, washed with acetone, dried and mixed with 27 g of sodium acetate in 550 mL of acetic anhydride. The mixture is then stirred for 2 h at reflux and cooled down at 0° C. The resulting precipitate is filtrated, washed with water, recrystalized in methanol and dried to yield the corresponding 1 as a pure white solid. Yield=71%; $^1$H-NMR (CDCl$_3$): δ (ppm) 1.18 (d, 6H), 1.56 (s, 2H), 2.79 (s, 2H), 2.94 m, 1H), 3.03 (s, 2H), 5.42 (s, 2H), 6.59 (s, 2H), 7.20 (d, 2H), 7.33 (d, 2H).

b) Polymer P1

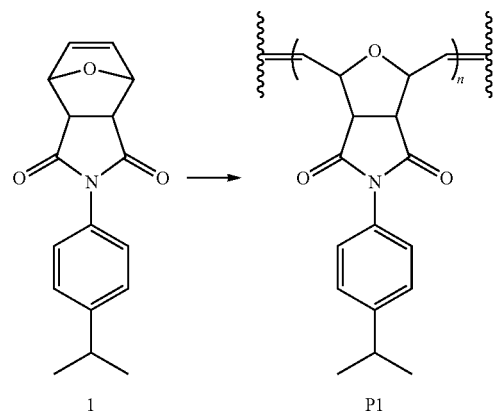

63 mg of (1,3-Bis-(2,4,6-trimethylphenyl)-2-imidazolidinylidene)dichloro(oisopropoxyphenylmethylene)ruthenium (0.5% mol, 100 μmol) is added to 2 g of 1 (1 eq, 18 mmol) in 15 mL of anhydrous dichloromethane under Nitrogen. After being stirred for 4 h at reflux, 10 mL of anhydrous dichloromethane and 1 mL of ethylvinylether are added. The mixture is poured in cold ethanol. The precipitate is filtrated, dissolved in a minimum amount of dichloromethane and poured in cold heptane. The precipitate is filtrated, dried to yield the corresponding pure polymer P1 as a white solid. Yield=61% Mw=161 kDa/PDI=2.1/Tg=228° C.

Sodium content 14 mg/kg
Phosphore content 24 mg/kg
Ruthenium content 117 mg/kg

EXAMPLE 2

In Analogy to Example 1, The Following Polymers are Prepared

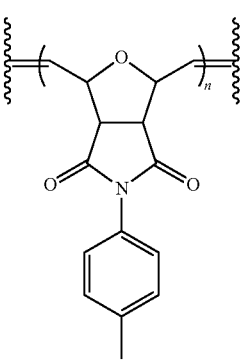

a) Polymer P2:
Mw=46.5 kDa
PDI=1.46
Tg=238° C.

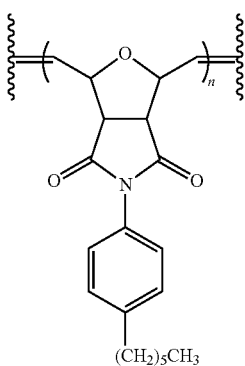

b) Polymer P3:
  Mw=69 kDa
  PDI=1.60
  Tg=144° C.

EXAMPLE 3

Preparation of a Top-gate, Bottom Contact (TGBC) Field Effect Transistor Comprising a Gate Dielectric Layer of P1

Gold is sputtered onto poly(ethylene terephthalate) (PET) foil to form an approximately 40 nm thick film and then source/drain electrodes (channel length: 10 μm; channel width: 10 mm) are structured by photolithography process. A 0.75% (weight/weight) solution of a diketopyrrolopyrrole (DPP)-thiophene-polymer (polymer 21-1 according to example 1 of WO2010/049321:

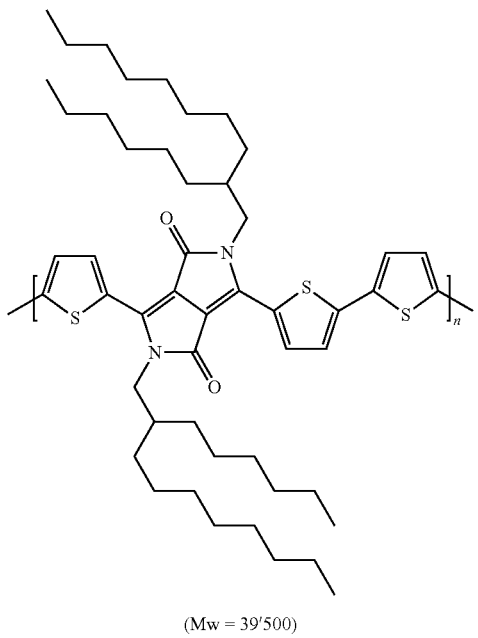

(Mw = 39'500)

in toluene is filtered through a 0.45 μm polytetrafluoroethylene (PTFE) filter and then applied by spin coating (15 seconds at 1300 rpm, acceleration 10.000 rpm/s. The wet organic semi-conducting polymer layer is dried at 100° C. on a hot plate for 30 seconds. A 8% (weight/weight) solution of P1 in Methoxypropyl Acetate is filtered through a 0.45 μm filter and then applied by spin coating (1100 rpm, 60 seconds). The wet layer film is pre-baked at 100° C. for 20 minutes on a hot plate to obtain a 365 nm thick layer. Gate electrodes of gold (thickness approximately 120 nm) are evaporated through a shadow mask on the P1 layer. The whole process is performed without a protective atmosphere.

Measurement of the characteristics of the top gate, bottom contact (TGBC) field effect transistors are measured with a Keithley® 2612A semiconductor parameter analyser.

The drain current $I_{ds}$ in relation to the gate voltage $V_{gs}$ (transfer curve) for the top-gate, bottom-contact (TGBC) field effect transistor comprising a P1 gate dielectric at a source voltage $V_{sd}$ of −20V (upper curves) is shown in FIG. 1.

The top-gate, bottom-contact (TGBC) field effect transistor comprising a P1 as gate dielectric shows a mobility of 0.36 cm$^2$/Vs (calculated for the saturation regime) and an Ion/Ioff ration of 5 E+5.

The drain current $I_{ds}$ in relation to the drain voltage $V_{ds}$ (output curve) for the top-gate, bottom-contact (TGBC) field effect transistor comprising P1 at a gate voltage $V_{gs}$ of 0V (squares), −5V (stars), −10V (lozenges), −15V (triangles), and −20V (circles) is shown in FIG. 2.

EXAMPLE 4

Preparation of a Capacitor

A 8% (weight/weight) solution of polymer P1 as obtained in example 1b in Methoxypropyl Acetate is filtered through a 0.45 μm filter and applied on a clean glass substrate with indium tin oxide (ITO) electrodes by spin coating (1100 rpm, 30 seconds). The wet film is pre-baked at 100° C. for 20 minutes on a hot plate to obtain a 490 nm thick layer. Gold electrodes (area=3 mm$^2$) are then vacuum-deposited through a shadow mask on the P1 layer at <1×10$^{-6}$ Torr.

The capacitor thus obtained is characterized in the following way:

The relative permittivity $\epsilon_r$ and the loss factor tg(δ)=$\epsilon_r''$ are deduced from the complex capacity measured with a LCR meter Agilent 4284A (signal amplitude 1 V). Current/Voltage (I/V) curves are obtained with a semiconductor parameter analyser Agilent 4155C. The breakdown voltage is the voltage Ed where the current reaches a value of 1 μA. The volume resistivity ρ is calculated from the resistance, sample thickness and electrode surface.

In the same way, capacitors are prepared and investigated using polymers 2 and 3. results are compiled in the below table.

| Polymer | ρ [Ωcm] | $\epsilon_r$ 20 Hz | $\epsilon_r$ 100 kHz | $\epsilon_r''$ 20 Hz | $\epsilon_r''$ 100 kHz | Ed [V/μm] |
|---|---|---|---|---|---|---|
| 1 | 2.5E+15 | 3.15 | 3.01 | 0.037 | 0.040 | >190 |
| 2 | 1.9E+15 | 3.05 | 2.92 | 0.037 | 0.022 | >143 |
| 3 | 3.8E+15 | 2.87 | 2.76 | 0.029 | 0.025 | 171 |

EXAMPLE 5

Alternative Preparation of Polymer a) Preparation of Monomer 2

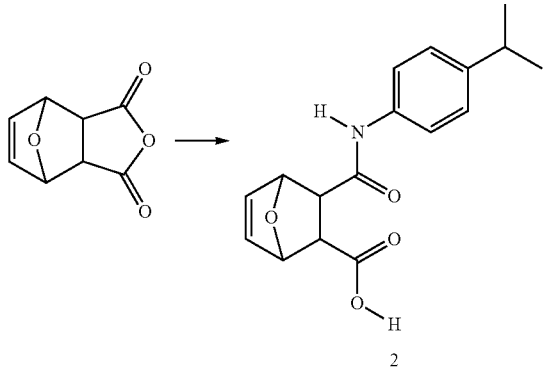 [SMILES: O=C1OC(=O)C2C3C=CC(O3)C12 ; CC(C)c1ccc(NC(=O)C2C3C=CC(O3)C2C(=O)O)cc1]

100 g of p-isopropylaniline (1 eq, 0.74 mol) is added to a solution of 122.9 g of exo-3,6-Epoxy-1,2,3,6-tetrahydrophthalic anhydride (1 eq, 0.74 mol) in acetone. The mixture is then stirred for 2 h. The resulting precipitate is filtrated, washed with acetone and dried to yield the corresponding pure 2 as a white solid. Yield=87%

$^1$H-NMR (DMSO): δ (ppm) 1.19 (d, 6H), 2.67 (d, 1H), 2.79 (d, 1H), 2.83 (m, 1H), 5.03 (s, 1H), 5.14 (s, 1H), 6.50 (m, 2H), 7.15 (d, 2H), 7.44 (d, 2H), 9.60 (s, 1H).

b) Preparation of Monomer 3

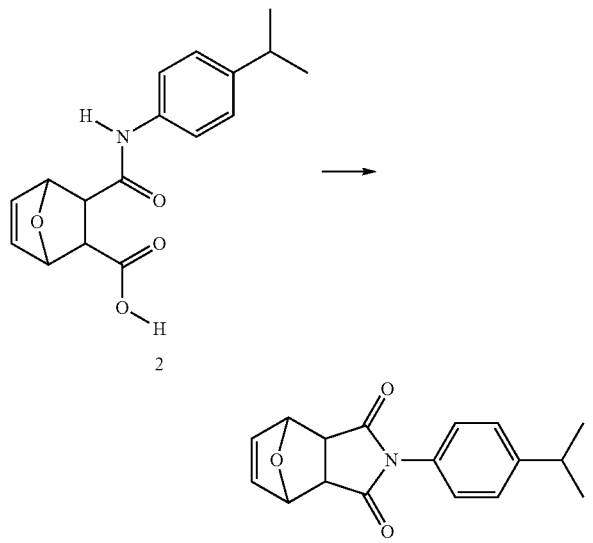

182.4 g of 2 (1 eq, 0.63 mol) is added to 550 mL of acetic anhydride and 27 g of sodium acetate (0.5 eq, 0.33 mol). The mixture is then stirred for 2 h at reflux and cooled down at 0° C. The resulting precipitate is filtrated, washed with water, recrystalized for methanol and dried to yield the corresponding pure 3 as a white solid. Yield=79% $^1$H-NMR (CDCl$_3$): δ (ppm) 1.18 (d, 6H), 1.56 (s, 2H), 2.79 (s, 2H), 2.94 (m, 1H), 3.03 (s, 2H), 5.42 (s, 2H), 6.59 (s, 2H), 7.20 (d, 2H), 7.33 (d, 2H).

c) Polymer P1'

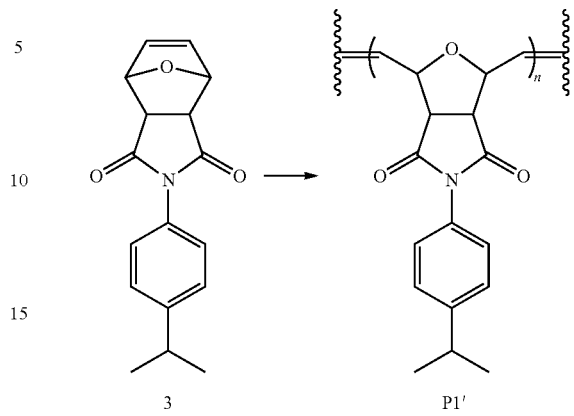

80 mg of Bis(tricyclohexylphosphine)benzylidine ruthenium(IV) dichloride (0.5% mol, 100 μmol) is added to 5 g of 3 (1 eq, 18 mmol) in 15 mL of anhydrous dichloromethane under Nitrogen. After being stirred for 5 h at room temperature, 10 mL of anhydrous dichloromethane and 1 mL of ethylvinylether are added. The mixture is poured in cold ethanol. The precipitate is filtrated, dissolved in a minimum amount of dichloromethane and poured in cold heptane. The precipitate is filtrated, dried to yield the corresponding pure polymer 1' as a white solid. Yield=61%

| | |
|---|---|
| Mw = | 128 kDa |
| PDI = | 3.4 |
| Tg = | 228° C. |
| Na content | 14 mg/kg |
| P content | 24 mg/kg |
| Ru content | 117 mg/kg |

Figure 1:
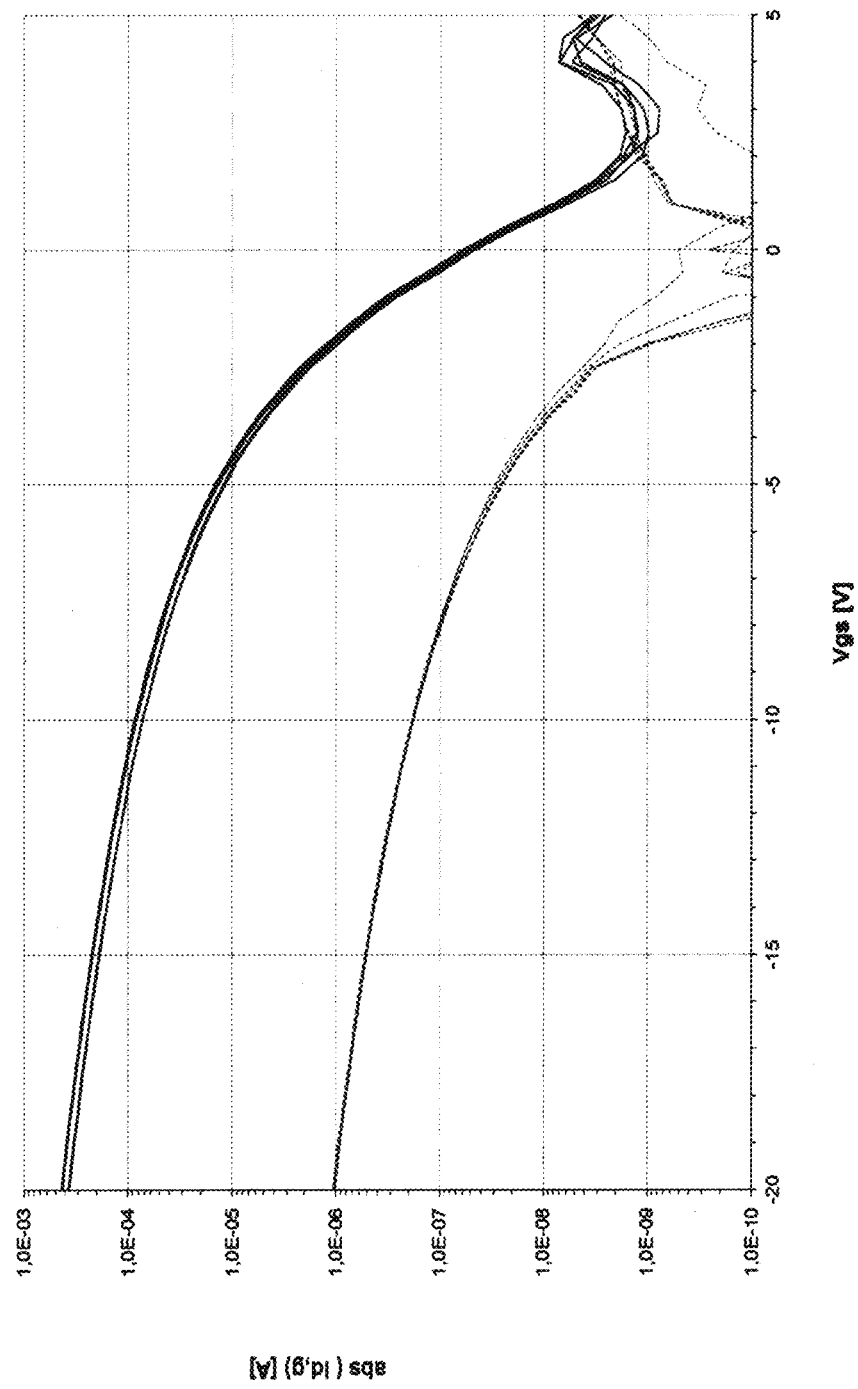
FIG. 1 shows drain current $I_{ds}$ in relation to the gate voltage $V_{gs}$ (transfer curve) for the TGBC field effect transistor comprising a polymer 1 gate dielectric at a source voltage $V_{sd}$ of −20V (upper curves).
Figure 2:
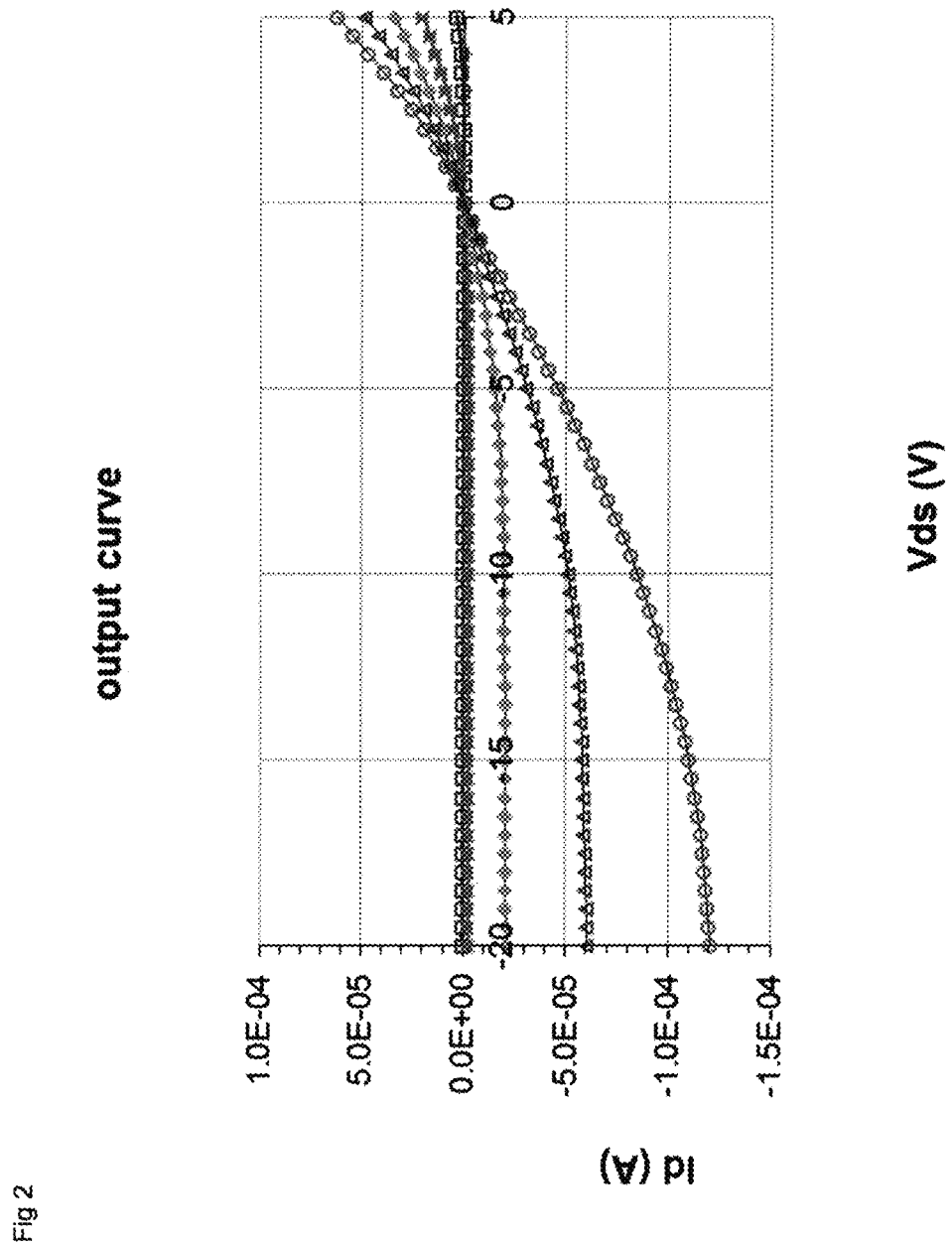
FIG. 2 shows the output curves for the TGBC field effect transistor comprising polymer 1 at a gate voltage $V_{gs}$ of 0V (squares), −5V (stars), −10V (lozenges), −15V (triangles), and −20V (circles).

The invention claimed is:

1. An electronic device containing at least one dielectric material which comprises an oxacycloolefinic polymer, which comprises a polymer chain of the formula III

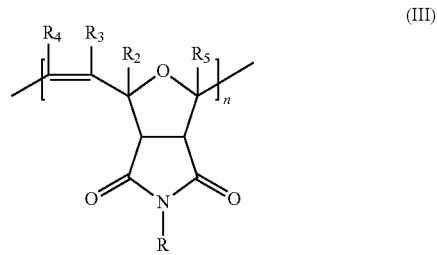

wherein n ranges from 3 to 100 000, each of $R_2$ to $R_5$ is selected from hydrogen and $C_1$-$C_4$alkyl, and R is hydrogen, $C_1$-$C_{25}$alkyl, $C_1$-$C_{25}$haloalkyl, phenyl, phenyl-$C_1$-$C_4$alkyl, cyclopentyl, or cyclohexyl, wherein phenyl moiety or cyclopentyl or cyclohexyl moiety itself is unsubstituted or substituted by $C_1$-$C_4$alkyl, $C_1$-$C_4$alkoxy, OH, halogen.

2. The electronic device according to claim 1, wherein the oxacycloolefinic polymer is prepared by Ru-carbene catalyzed ring-opening metathesis polymerization of a bicyclic oxaolefin.

3. The electronic device according to claim 1, wherein the oxacycloolefinic polymer is present as a layer essentially consisting of the oxacycloolefinic polymer.

4. The electronic device according to claim 1, wherein the oxacycloolefinic polymer has a glass transition temperature, as determined by differential scanning calorimetry, above 90° C.

5. The electronic device according to claim 1, wherein the electronic device is selected from capacitors, transistors such as organic field effect transistors, and devices comprising said capacitor and/or transistor.

6. The electronic device according to claim 1, further comprising a substrate and comprising at least one further layer of a functional material in direct contact with the oxacycloolefinic polymer dielectric.

7. The electronic device according to claim 6, wherein a layer of the oxacycloolefinic polymer as a dielectric material is in direct contact with an electrode layer and/or a semiconductor layer.

8. The electronic device according to claim 6, wherein a layer of the oxacycloolefinic polymer as a dielectric material is in direct contact with a semiconductor layer that comprises a copolymer of the diketopyrrolopyrrole class.

9. The electronic device according to claim 1, wherein the dielectric material is a dielectric layer in a printed electronic device.

10. The electronic device according to claim 9, wherein the printed electronic device is a capacitor or an organic field-effect transistor.

11. A process for the preparation of an electronic device according to claim 1, the process comprising;
providing a solution or dispersion of the oxacycloolefinic polymer of formula III in a solvent, and
applying the solution or the dispersion in the form of a layer onto a substrate, an electrode material or a semiconductor, and
drying said layer.

12. The process according to claim 11, wherein the solution or the dispersion includes at least 8% by weight of the oxacycloolefinic polymer in solution.

13. The electronic device according to claim 1, wherein the oxacycloolefinic polymer has a molecular weight, as determined by gel permeation chromatography, in a range of 10,000 to 1,000,000 g/mol.

14. A gate insulator layer comprising an oxacycloolefinic polymer comprising a polymer chain of formula III

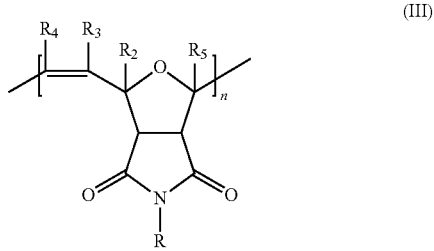

(III)

wherein n ranges from 3 to 100 000,
each of $R_2$ to $R_5$ is selected from hydrogen and $C_1$-$C_4$alkyl, and
R is hydrogen, $C_1$-$C_{25}$alkyl, $C_1$-$C_{25}$haloalkyl, phenyl, phenyl-$C_1$-$C_4$alkyl, cyclopentyl, or cyclohexyl, wherein phenyl moiety or cyclopentyl or cyclohexyl moiety itself is unsubstituted or substituted by $C_1$-$C_4$alkyl, $C_1$-$C_4$alkoxy, OH, halogen.

* * * * *